(12) United States Patent
Lee et al.

(10) Patent No.: US 7,449,919 B2
(45) Date of Patent: Nov. 11, 2008

(54) DRIVER CIRCUIT BIAS CONTROL

(75) Inventors: Tea M. Lee, Federal Way, WA (US);
Ronald W. Swartz, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 11/479,260

(22) Filed: Jun. 30, 2006

(65) Prior Publication Data

US 2008/0001632 A1    Jan. 3, 2008

(51) Int. Cl.
*H03K 19/094* (2006.01)

(52) U.S. Cl. .......................... 326/83; 326/87

(58) Field of Classification Search ............. 326/33–34, 326/93, 95, 98, 112, 115, 121, 127, 82–83, 326/86–87

See application file for complete search history.

(56) References Cited

U.S. PATENT DOCUMENTS

| | | | | |
|---|---|---|---|---|
| 6,882,179 | B2 * | 4/2005 | Knee | 326/83 |
| 6,897,685 | B2 * | 5/2005 | Sato | 326/86 |
| 2001/0052801 | A1 * | 12/2001 | Zhang | 327/52 |
| 2006/0223480 | A1 * | 10/2006 | Mohanavelu et al. | 455/310 |

* cited by examiner

*Primary Examiner*—Rexford Barnie
*Assistant Examiner*—Thienvu V Tran
(74) *Attorney, Agent, or Firm*—Dana B. Lemoine; Lemoine Patent Services, PLLC

(57) ABSTRACT

A bias circuit includes multiple output legs. During a transition from a low power state to an operational state, multiple output legs are turned on to provide a bias voltage. After a suitable period, at least one of the multiple output legs is turned off.

16 Claims, 5 Drawing Sheets

DRIVER CIRCUIT BIAS CONTROL

FIELD

The present invention relates generally to bias circuits, and more specifically to the control of bias circuits.

BACKGROUND

Integrated circuits such as processors, memory devices, memory controllers, input/output (I/O) controllers, and the like typically communicate with each other using digital data signals and clock signals. Some systems use high speed serial or parallel data links such Peripheral Component Interconnect (PCI) links, PCI-Express links, parallel Advanced Technology Attached (ATA) links, serial ATA links or the like.

Circuits that implement high speed serial or parallel data links may operate in different states. For example, if a driver circuit is not in use, it may transition from a fully operational state to a reduced power state. Transitioning back from a reduced power state to a fully operational state may take a varying amount of time, depending at least in part on the circuit topology of bias circuits that provide bias currents and/or bias voltages to the driver circuit.

DESCRIPTION OF EMBODIMENTS

Figure 1:
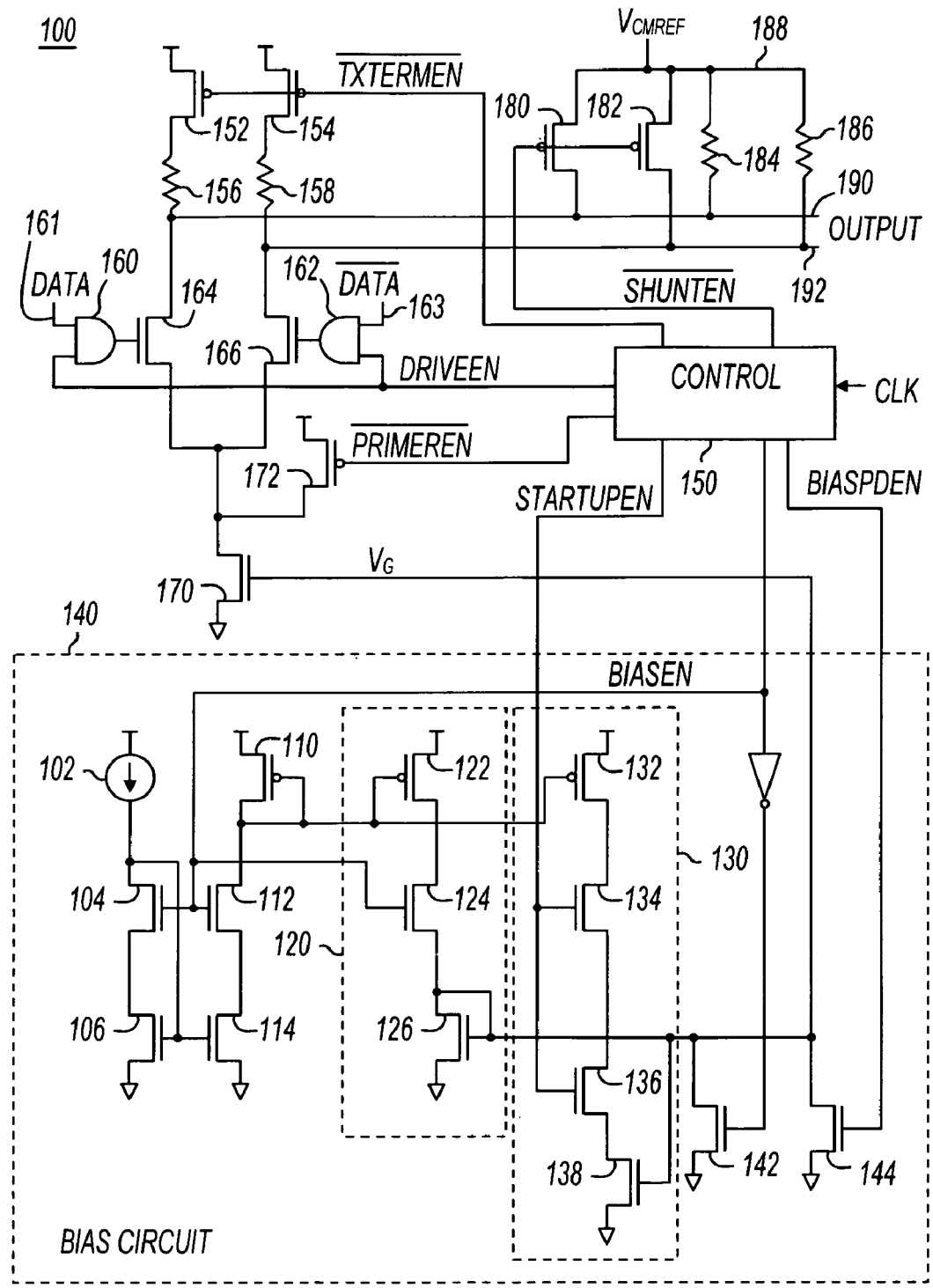
FIG. 1 shows a driver circuit in accordance with various embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a driver circuit in accordance with various embodiments of the present invention. Driver circuit 100 includes differential pair of transistors 164 and 166, tail current transistor 170, input logic 160 and 162, resistors 156 and 158, and termination-enabling transistors 152 and 154. Driver circuit 100 also includes shunt transistors 180 and 182, terminations 184 and 186, primer transistor 172, control circuit 150, and bias circuit 140.

The transistors in FIG. 1 are shown as insulated gate transistors, and specifically as metal oxide semiconductor field effect transistors (MOSFETs). For example, transistors 152, 154, 180, 182, and 172 are shown as P-type MOSFETs, and transistors 164, 166, and 170 are shown as N-type MOSFETs. Other types of switching or amplifying elements may be utilized for the various transistors of driver circuit 100 without departing from the scope of the present invention. For example, the transistors of circuit 100 may be junction field effect transistors (JFETs), bipolar junction transistors (BJTs), or any device capable of performing as described herein.

Driver circuit 100 may have multiple states. For example, driver circuit 100 may have a "normal operation" state in which differential data is received on nodes 161 and 163, and output data is driven on nodes 190 and 192. Also for example, driver circuit may have a reduced power state in which bias circuit 140 removes the gate bias voltage $V_G$ from tail current transistor 170, thereby reducing power consumption, and the output nodes 190 and 192 are held at a common-mode reference voltage $V_{CMREF}$. Various embodiments of driver circuit 100, normal operation states, and reduced power states are described below. Further described are various embodiments in which driver circuit 100 transitions between normal operation and reduced power states.

Control circuit 150 provides control signals to various circuit elements shown in FIG. 1. Control circuit 150 is responsive to a clock signal, and is also responsive to control information (not shown) provided by other circuit elements. For example, control circuit 150 may receive control information from a microprocessor. Further, control circuit 150 may receive control information from a local controller, such as a memory controller or input/output (I/O) controller. The manner in which control circuit 150 is influenced by other circuit elements is not a limitation of the present invention.

Control circuit 150 provides the DRIVEEN (active high driver enable) signal to input logic 160 and 162. When DRIVEEN is high, the differential input data is passed through the input logic to the differential pair of transistors 164 and 166. When DRIVEEN is low, the differential input data is blocked by the input logic, and the differential pair of transistors 164 and 166 are turned off.

Control circuit 150 also provides the $\overline{\text{TXTERMEN}}$ (active low transmit termination enable) signal to termination-enabling transistors 152 and 154. When $\overline{\text{TXTERMEN}}$ is low, transistors 152 and 154 are on, providing a current path to termination resistors 156 and 158. When $\overline{\text{TXTERMEN}}$ is high, transistors 152 and 154 are off, and no such current path exists. Transistors 152 and 154 operate as switches responsive to the $\overline{\text{TXTERMEN}}$ signal to enable load devices shown as resistors 156 and 158 in FIG. 1.

Control circuit 150 also provides the $\overline{\text{SHUNTEN}}$ (active low shunt enable) signal to shunt transistors 180 and 182. When $\overline{\text{SHUNTEN}}$ is low, shunt transistors 180 and 182 are on, shunting output nodes 190 and 192 to node 188, which is supplied with a common-mode reference voltage, $V_{CMREF}$. When $\overline{\text{SHUNTEN}}$ is high, shunt transistors 180 and 182 are off.

Control circuit 150 also provides the $\overline{\text{PRIMEREN}}$ (active low primer enable) signal to primer transistor 172. When $\overline{\text{PRIMEREN}}$ is low, primer transistor 172 is on, providing a current path to tail current transistor 170. When $\overline{\text{PRIMEREN}}$ is high, primer transistor 172 is off. Primer transistor 172 may be turned on to provide a current path to tail current transistor 170 when differential pair of transistors 164 and 166 are turned off. Various embodiments incorporating the use of primer transistor 172 are described more fully below.

Control circuit 150 also provides control signals to bias circuit 140. For example, control circuit 150 is shown providing BIASEN (active high bias enable), STARTUPEN (active high start-up enable), and BIASPDNEN (active high bias pull down enable) signals to bias circuit 140. The operation of bias circuit 140 and these control signals are described more fully below.

In normal operation, primer transistor 172 is off, termination-enabling transistors 152 and 154 are on, shunt transistors 180 and 182 are off, and DRIVEEN is asserted high to allow data to pass through the input logic. Bias circuit 140 provides a gate bias voltage $V_G$ to tail current transistor 170, and tail current transistor 170 provides a current that is switched between differential pair of transistors 164 and 166. The switched-current creates a differential voltage across resistors 156 and 158, thereby producing a differential output voltage at nodes 190 and 192. Accordingly, the output data on output nodes 190 and 192 is controlled by the differential input data. Although driver circuit 100 is shown having resistors 156 and 158 as load devices, this is not a limitation of the present invention. For example, in some embodiments, driver circuit 100 includes active load devices.

Driver circuit 100 may be put in a low power state by removing the gate bias voltage $V_G$, thereby turning off tail current transistor 170 and reducing power consumption. Further, DRIVEEN may be de-asserted low, and $\overline{\text{TATERMEN}}$ may be de-asserted high, thereby isolating output nodes 190 and 192 from any influence provided by differential pair of transistors 164 and 166, and resistors 156 and 158. In this state, $\overline{\text{SHUNTEN}}$ may be asserted low or de-asserted high. When asserted low, shunt transistors 180 and 182 provide a low impedance coupling between output nodes 190 and 192 and $V_{CMREF}$. When de-asserted high, shunt transistors 180 and 182 are off, and termination resistors 184 and 186 provide a higher impedance coupling between output nodes 190 and 192. In some embodiments, shunt transistors 180 and 182 are turned on during a transition time between a low power state and an operational state to reduce noise on output nodes 190 and 192, but are otherwise turned off. Examples of this are described below with reference to FIG. 2.

Bias circuit 140 includes circuitry to produce the gate bias voltage for tail current transistor 170. Bias circuit 140 includes current source 102 and transistors 104, 106, 110, 112, and 114 arranged as a controllable current mirror. For example, the current in current source 102 is mirrored to provide a current through transistor 110. In some embodiments, through transistor sizing and other methods, the mirrored current in transistor 110 may be any multiple of the reference current provided by current source 102. Transistors 104 and 112 have a bias voltage provided by the BIASEN signal by control circuit 150. When control circuit 150 asserts the BIASEN signal high, the current mirror just described is on and the reference current from current source 102 is mirrored in transistor 110. When control circuit 150 de-asserts the BIASEN signal low, transistors 104 and 112 are turned off, thereby starving current from both transistors 106 and 110.

Bias circuit 140 includes two output legs 120 and 130. Each of these output legs may be turned on to mirror the current in transistor 110. Output leg 120 is turned on by the BIASEN signal, and output leg 130 is turned on by the STARTUPEN signal. Output leg 120 includes transistors 122, 124, and 126, and output leg 130 includes transistors 132, 134, 136, and 138.

Bias circuit 140 also includes pull down transistors 142 and 144. Bias transistor 142 pulls down the gate of transistor 170 when the BIASEN signal is de-asserted low. Likewise, pull down transistor 144 pulls down the gate of tail current transistor 170 when the BIASPDEN signal is asserted high. In some embodiments transistors 142 and 144 may have different characteristics. For example, transistor 144 may be a highly resistive device (long channel device) used to slowly pull down the gate of tail current transistor 170. By slowly turning off tail current transistor 170, power supply transients may be reduced. Also for example, transistor 142 may have a low "on" impedance useful to hold the gate of tail current transistor 170 low. In operation, when turning off tail current transistor 170, BIASPDEN may be asserted high some number clocks prior to BIASEN being deasserted low. This allows transistor 144 to drain sufficient charge from the gate of tail current transistor 170, before turning on transistor 142.

Tail current transistor 170 may be a relatively large transistor to provide sufficient tail current to be switched between differential pair of transistors 164 and 166. For example, and not by way of limitation, tail current transistor 170 may be sized to source approximately 20 mA. As a result, the gate capacitance of tail current transistor 170 may be relatively large, and may present a significant capacitive load to bias circuit 140. Additional capacitance may also exist on the same circuit node as the gate of tail current transistor 170, thereby providing an even greater capacitive load to bias circuit 140. For example, metal traces and other devices may be present. Also for example, additional capacitance may be intentionally added for decoupling purposes.

When bias circuit 140 is starting up or transitioning from a low power state to an operational state, both BIASEN and STARTUPEN may be asserted by control circuit 150 to enable both output legs 120 and 130 for multiple clock periods. By enabling multiple output legs, the gate of tail current transistor 170 may be charged more quickly. In some embodiments, output leg 130 is sized to provide a larger current than output leg 120. In these embodiments, a significantly greater current may be provided to charge the gate of tail current transistor 170 during startup of bias circuit 140.

In some embodiments, device sizes in output leg 130 have a defined ratio to device sizes in output leg 120. For example, in some embodiments, transistors 132 and 138 are twice the size of transistors 122 and 126, respectively. Also for example, transistors 134 and 136 may be twice the size of transistor 124. When output leg 130 is made larger, the settling time of the bias voltage $V_G$ on the gate of tail current transistor 170 may be reduced. In addition, when output leg 130 is large, voltage variations on the gate of tail current transistor 170 are reduced during power state transitions, and this may reduce any common mode variations on output nodes 190 and 192 during power state transitions.

After the gate bias voltage has reached a suitable value, or after a predetermined number of clock periods, control circuit 150 de-asserts STARTUPEN low to turn off output leg 130, and operates steady-state with less than all output legs enabled in bias circuit 140.

FIG. 1 shows two output legs in bias circuit 140. In some embodiments, more than two output legs exist. For example, more than one additional leg may be enabled by the STARTUPEN signal to lower the time needed to charge the gate of tail current transistor 170. Further, in some embodiments, multiple individually controlled output legs are provided. Any number of output legs controlled by any number of different startup enable signals may exist without departing from the scope of the present invention.

In some embodiments, additional output legs may be tailored to the frequency of operation or multiple possible frequencies of operation. For example, if a transmitter/driver supports multiple data rates (with clock rate also changing), additional bias legs may be enabled and/or disabled based on this clock rate. In various embodiments of the invention, driver circuit 100 may operate in of two modes: half-frequency mode; or full frequency mode. Control bock 150 may scale with clock rate, so for half-frequency, twice the time may be available for the bias voltages to settle. In this mode, bias leg 130 may be disabled giving the $V_G$ bias voltage more time to settle. This may be implemented for circuits that support any number of data rates (e.g., SATA supports multiple data rates).

Driver circuit 100 may implement any type of communications circuit. For example, driver circuit 100 may be a PCI compliant driver circuit, a PCI-Express compliant driver circuit, or may be any other type of driver circuit. In some embodiments, driver circuit 100 enters an "electrical idle" state as a low power state. For example, control circuit 150 may influence the operation of driver circuit 100 to enter a PCI-Express compliant electrical idle state, and to emerge from that electrical idle state to an operational state. In some embodiments, the numbering and sizing of additional bias circuit output legs may be determined to satisfy PCI compliant emergence from an electrical idle state.

As shown in FIG. 1, driver circuit 100 a differential pair of NMOSFET transistors (164, 166) and an NMOSFET tail current transistor 170, but this is not a limitation of the present invention. For example, in some embodiments, driver circuit 100 includes a differential pair of PMOSFET transistors and a PMOSFET tail current transistor. Also for example, in other embodiments, driver circuit 100 includes a push-pull driver including both PMOSFET and NMOSFET transistors.

Figure 2:
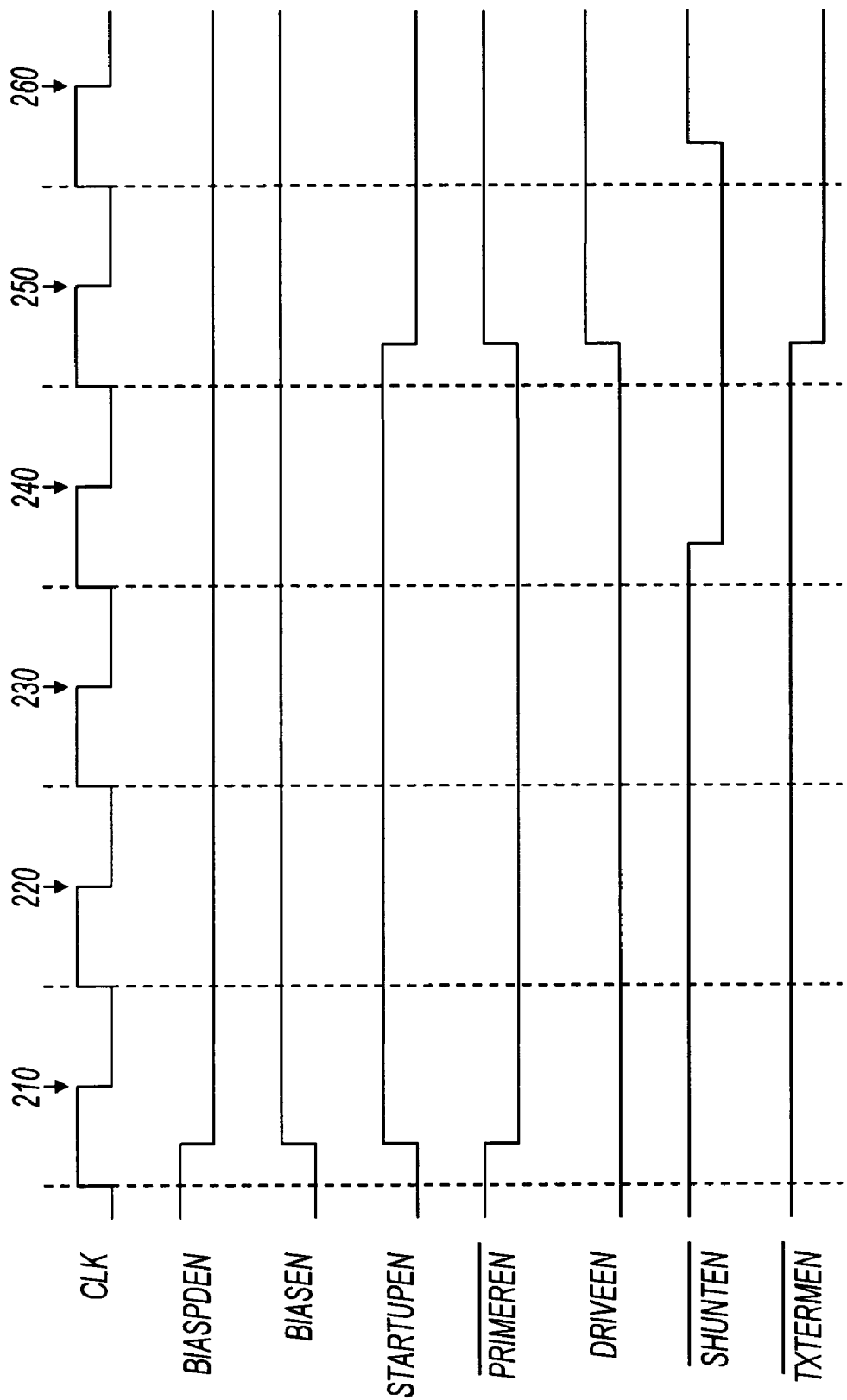
FIG. 2 shows a timing diagram.

FIG. 2 shows a timing diagram. Timing diagram 200 shows a sequence to transition from a low power state to an operational state. For example, driver circuit 100 may utilize the sequence of FIG. 2 to emerge from a PCI compliant electrical idle state. The signals shown in timing diagram 200 are all produced by control circuit 150 with the exception of CLK, which is a clock signal sourced to control circuit 150. Timing diagram 200 is separated into clock periods, and operations performed in each clock period are described in the following paragraphs.

Prior to period 210, driver circuit 100 is in a low power state, such as a PCI compliant electrical idle state. BIASPDEN is asserted high to pull down the gate of tail current transistor 170. BIASEN and STARTUPEN are both de-asserted low to disable most of bias circuit 140. $\overline{\text{PRIMEREN}}$ is de-asserted high to turn off primer transistor 172. DRIVEEN is de-asserted low to turn off differential pair of transistors 164 and 166. $\overline{\text{SHUNTEN}}$ and TXTERMEN are both de-asserted high to turn off transistors 152, 154, 180 and 182.

When driver circuit 100 is in this state, output nodes 190 and 192 are held at the common-mode reference voltage $V_{CMREF}$ by resistors 184 and 186. In some embodiments, resistors 184 and 186 are fairly high impedance (e.g., 10,000 Ohms). In these embodiments, resistors 184 and 186 may be left in the circuit during normal operation without having an adverse impact on the output data.

During period 210, driver circuit 100 begins the process of emerging from a low power state. BIASPDEN is de-asserted low to turn off pull down transistor 144. BIASEN is asserted high to turn on transistors 104, 112, and 124, and turn off transistor 142. STARTUPEN is asserted high to turn on transistors 134 and 136, thereby enabling output leg 130. In addition, $\overline{\text{PRIMEREN}}$ is asserted low to turn on primer transistor 172.

As a result of the signal transitions made in period 210, the gate voltage $V_G$ on tail current transistor 170 begins to ramp up. Differential pair of transistors 164 and 166 remain off, and a current path is provided to tail current transistor 170 through primer transistor 172. The gate nodes transistors of 106 and 114 quickly reach their final voltage because capacitance is small. Likewise, the gate node of transistor 110 also reaches a final voltage value quickly. Both output legs 120 and 130 are enabled to provide additional current to charge the gate node of tail current transistor 170. The control signals remain in the same state during periods 220 and 230. During this time, both output legs 120 and 130 remain enabled to provide current to charge the gate node of tail current transistor 170.

At period 240, $\overline{\text{SHUNTEN}}$ is asserted low to turn on shunt transistors 180 and 182. Shunt transistors 180 and 182 provide a low impedance path between $V_{CMREF}$ and output nodes 190 and 192 when turned on. At period 250, TXTERMEN is asserted high to turn on termination-enabling transistors 152 and 154. At the same time, DRIVEEN is asserted high to allow the differential data to pass through the input logic and turn on differential pair of transistors 164 and 166. Also at the same time, $\overline{\text{PRIMEREN}}$ is de-asserted high to turn off primer transistor 172. As a result of the signal transitions in period 250, current provided by tail current transistor 170 is switched from primer transistor 172 to differential pair of transistors 164 and 166. Any signal noise potentially created on output nodes 190 and 192 as a result of this current switch is reduced by the low impedance path to $V_{CMREF}$ provided by shunt transistors 180 and 182.

Also at period 250, STARTUPEN is deasserted low to turn off transistors 134 and 136, thereby disabling output leg 130. In some embodiments, STARTUPEN remains longer to reduce transients on the gate of tail current transistor 170 when DRIVEEN is asserted and $\overline{\text{PRIMEREN}}$ is deasserted. The timing of STARTUPEN and $\overline{\text{PRIMEREN}}$ are not fixed, and may be extended.

At period 260, $\overline{\text{SHUNTEN}}$ is de-asserted low, and shunt transistors 180 and 182 are turned off. At this point in time, driver circuit 100 is in an operational state, and differential data provided on nodes 161 and 163 is amplified and driven as output data on output nodes 190 and 192.

Figure 3:
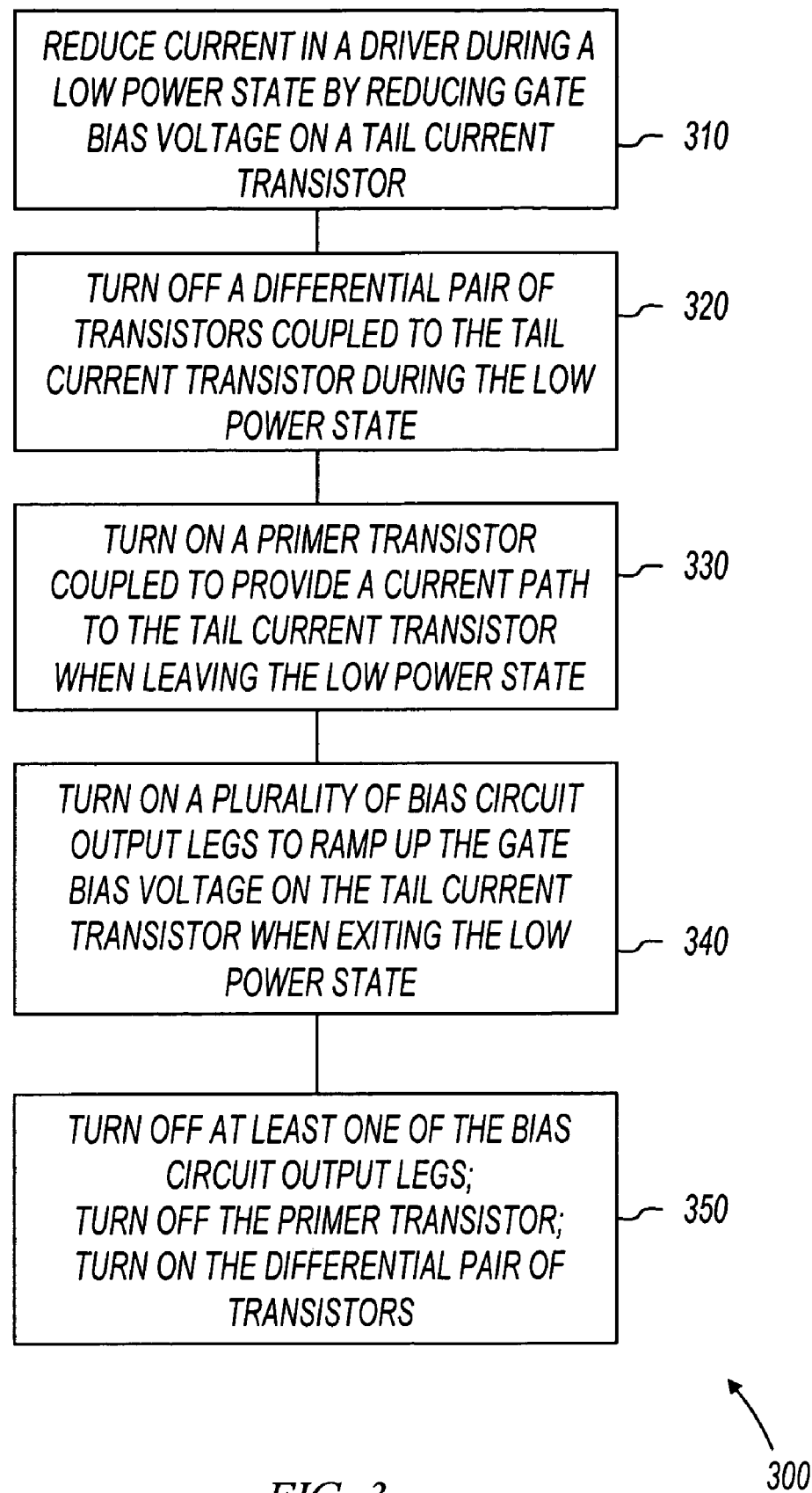
FIG. 3 shows a flowchart in accordance with various embodiments of the present invention.

FIG. 3 shows a flowchart in accordance with various embodiments of the present invention. In some embodiments, method 300 may be used to perform a transition from a low power state to an operational state in a driver circuit or a bias circuit. In some embodiments, method 300, or portions thereof, is performed by a driver circuit in an integrated circuit, embodiments of which are shown in the various figures. In other embodiments, method 300 is performed by a controller or memory device. Method 300 is not limited by the particular type of apparatus performing the method. The various actions in method 300 may be performed in the order presented, or may be performed in a different order. Further, in some embodiments, some actions listed in FIG. 3 are omitted from method 300.

Method 300 begins at 310 in which current in a driver is reduced during a low power state by reducing gate bias voltage on a tail current transistor. This may correspond to bias circuit 140 (FIG. 1) reducing gate bias voltage $V_G$ on tail current transistor 170. At 320, a differential pair of transistors coupled to the tail current transistor is turned off during the low power state. In some embodiments, this corresponds to control circuit 150 (FIG. 1) de-asserting the DRIVEEN signal low, thereby turning off differential pair of transistors 164 and 166.

At 330, a primer transistor coupled to provide a current path to the tail current transistor is turned on when leaving the low power state. This may correspond to control circuit 150 (FIG. 1) asserting the $\overline{\text{PRIMEREN}}$ signal low to turn on primer transistor 172 to provide a current path for tail current transistor 170. At 340, a plurality of bias circuit output legs are turned on to ramp up the gate bias voltage on the tail current transistor when exiting the low power state. In some embodiments, this corresponds to output legs 120 and 130 within bias circuit 140 (FIG. 1) being turned on simultaneously to ramp up the gate bias voltage on tail current transistor 170.

At 350, at least one of the bias circuit output legs is turned off, the primer transistor is turned off, and the differential pair of transistors is turned on. In some embodiments, this corresponds to turning off output leg 130 by de-asserting the STARTUPEN signal, turning off primer transistor 172 by de-asserting the $\overline{\text{PRIMEREN}}$ signal, and asserting the DRIVEEN signal to turn on differential pair of transistors 164 and 166.

Figure 4:
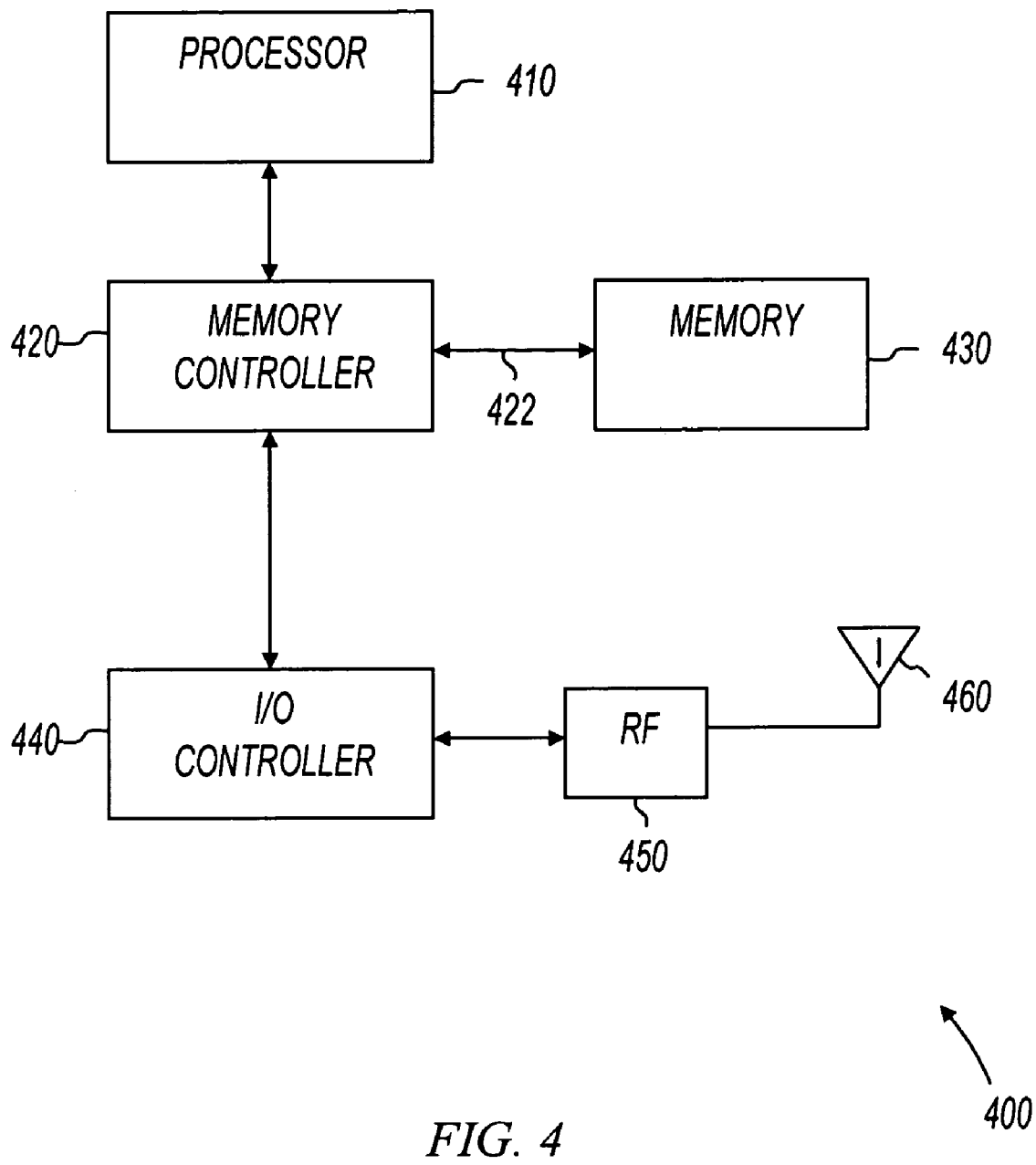
FIGS. 4 and 5 show diagrams of electronic systems in accordance with various embodiments of the present invention.

FIG. 4 shows an electronic system in accordance with various embodiments of the present invention. Electronic system 400 includes processor 410, memory controller 420, memory 430, input/output (I/O) controller 440, radio frequency (RF) circuits 450, and antenna 460. In operation, system 400 sends and receives signals using antenna 460, and these signals are processed by the various elements shown in FIG. 4. Antenna 460 may be a directional antenna or an omni-directional antenna. As used herein, the term omni-directional antenna refers to any antenna having a substantially uniform pattern in at least one plane. For example, in some embodiments, antenna 460 may be an omni-directional antenna such as a dipole antenna, or a quarter wave antenna. Also for example, in some embodiments, antenna 460 may be a directional antenna such as a parabolic dish antenna, a patch antenna, or a Yagi antenna. In some embodiments, antenna 460 may include multiple physical antennas.

Radio frequency circuit 450 communicates with antenna 460 and I/O controller 440. In some embodiments, RF circuit 450 includes a physical interface (PHY) corresponding to a communications protocol. For example, RF circuit 450 may include modulators, demodulators, mixers, frequency synthesizers, low noise amplifiers, power amplifiers, and the like. In some embodiments, RF circuit 450 may include a heterodyne receiver, and in other embodiments, RF circuit 450 may include a direct conversion receiver. In some embodiments, RF circuit 450 may include multiple receivers. For example, in embodiments with multiple antennas 460, each antenna may be coupled to a corresponding receiver. In operation, RF circuit 450 receives communications signals from antenna 460, and provides analog or digital signals to I/O controller 440. Further, I/O controller 440 may provide signals to RF circuit 450, which operates on the signals and then transmits them to antenna 460.

Processor 410 may be any type of processing device. For example, processor 410 may be a microprocessor, a microcontroller, or the like. Further, processor 410 may include any number of processing cores, or may include any number of separate processors.

Memory controller 420 provides a communications path between processor 410 and other devices shown in FIG. 4. In some embodiments, memory controller 420 is part of a hub device that provides other functions as well. As shown in FIG. 4, memory controller 420 is coupled to processor 410, I/O controller 440, and memory 430.

Memory 430 may be any type of memory technology. For example, memory 430 may be random access memory (RAM), dynamic random access memory (DRAM), static random access memory (SRAM), nonvolatile memory such as FLASH memory, or any other type of memory. Further, memory 430 may include multiple memory devices where each of the memory devices includes the circuitry described with reference to FIG. 1.

Memory 430 may represent a single memory device or a number of memory devices on one or more memory modules. Memory controller 420 provides data through bus 422 to memory 430 and receives data from memory 430 in response to read requests. Commands and/or addresses may be provided to memory 430 through conductors other than bus 422 or through bus 422. Memory controller 420 may receive data to be stored in memory 430 from processor 410 or from another source. Memory controller 420 may provide the data it receives from memory 430 to processor 410 or to another destination. Bus 422 may be a bi-directional bus or unidirectional bus. Bus 422 may include many parallel conductors. The signals may be differential or single ended. In some embodiments, bus 422 operates using a forwarded, multiphase clock scheme.

Memory controller 420 is also coupled to I/O controller 440, and provides a communications path between processor 410 and I/O controller 440. I/O controller 440 includes circuitry for communicating with I/O circuits such as serial ports, parallel ports, universal serial bus (USB) ports, and the like. As shown in FIG. 4, I/O controller 440 provides a communications path to RF circuits 450.

Any of the integrated circuits shown in FIG. 4 (or FIG. 5, below) may include driver circuit embodiments described herein. For example, driver circuit 100 (FIG. 1) may be included in one or more of processor 410, memory controller 420, memory 430, or I/O controller 440. In some embodiments, bus 422 includes a plurality of PCI-Express high speed serial links, and memory controller 420 includes a plurality of driver circuits 100 to drive signals on the links. In these embodiments, links on bus 422 may emerge from PCI compliant electrical idle states as described herein.

Figure 5:
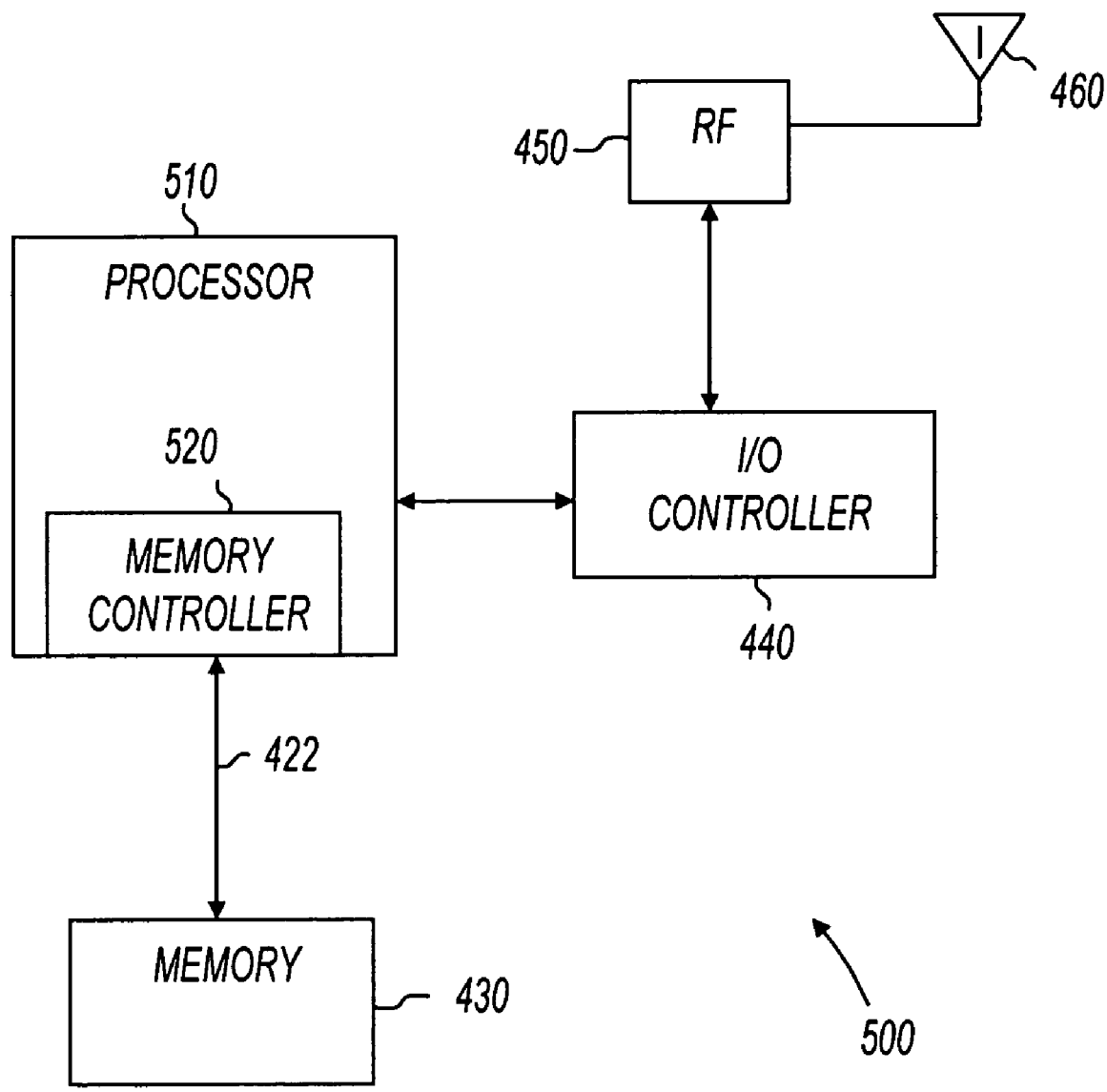

FIG. 5 shows an electronic system in accordance with various embodiments of the present invention. Electronic system 500 includes memory 430, I/O controller 440, RF circuits 450, and antenna 460, all of which are described above with reference to FIG. 4. Electronic system 500 also includes processor 510 and memory controller 520. As shown in FIG. 5, memory controller 520 is included in processor 510. Processor 510 may be any type of processor as described above with reference to processor 410 (FIG. 4). Processor 510 differs from processor 410 in that processor 510 includes memory controller 520, whereas processor 410 does not include a memory controller.

Example systems represented by FIGS. 4 and 5 include desktop computers, laptop computers, cellular phones, personal digital assistants, wireless local area network interfaces, or any other suitable system. Many other systems uses for driver circuit bias control exist. For example, the bias control embodiments described herein may be used in a server computer, a network bridge or router, or any other system with or without an antenna.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A driver circuit comprising:
   a differential pair of transistors;
   a tail current transistor coupled to provide a current to the differential pair of transistors;

a bias circuit to bias the tail current transistor, wherein the bias circuit includes a plurality of individually selectable output legs coupled in parallel;

a control circuit responsive to a clock signal, the control circuit coupled to turn on the plurality of individually selectable output legs for at least one clock signal period and then turn off at least one of the plurality of individually selectable output legs;

a first switching transistor coupled drain-to-source between a gate of the tail current transistor and a reference node, wherein the first switching transistor is coupled to turn off the tail current transistor responsive to the control circuit; and a second switching transistor coupled drain-to-source between the gate of the tail current transistor and the reference node, the second switching transistor having a higher "on" resistance than the first switching transistor.

2. The driver circuit of claim 1 wherein the control circuit is operable to provide a substantially PCI-Express compliant exit from an electrical idle state.

3. The driver circuit of claim 1 wherein the plurality of individually selectable output legs comprises two selectable output legs.

4. The driver circuit of claim 1 wherein the plurality of individually selectable output legs include transistors having sizes ratioed between the output legs.

5. A driver circuit comprising:
a differential pair of transistors;
a tail current transistor coupled to provide a current to the differential pair of transistors;
a bias circuit to bias the tail current transistor, wherein the bias circuit includes a plurality of individually selectable output legs coupled in parallel;
a control circuit responsive to a clock signal, the control circuit coupled to turn on the plurality of individually selectable output legs for at least one clock signal period and then turn off at least one of the plurality of individually selectable output legs;
logic to allow the differential pair of transistors to be driven by a differential data signal to provide an output data signal, or to be driven by a control signal to turn off the differential pair of transistors; and
a primer transistor coupled to provide a current path to the tail current transistor when the differential pair of transistors are turned off.

6. The driver circuit of claim 5 wherein the primer transistor is coupled to be responsive to the control circuit, and the primer transistor is turned on during the at least one clock signal period to provide a current path to the tail current transistor.

7. The driver circuit of claim 5 wherein the control circuit is operable to provide a substantially PCI-Express compliant exit from an electrical idle state.

8. The driver circuit of claim 5 wherein the plurality of individually selectable output legs comprises two selectable output legs.

9. The driver circuit of claim 5 wherein the plurality of individually selectable output legs include transistors having sizes ratioed between the output legs.

10. A driver circuit comprising:
a differential pair of transistors;
a tail current transistor coupled to provide a current to the differential pair of transistors;
a bias circuit to bias the tail current transistor, wherein the bias circuit includes a plurality of individually selectable output legs coupled in parallel;
a control circuit responsive to a clock signal, the control circuit coupled to turn on the plurality of individually selectable output legs for at least one clock signal period and then turn off at least one of the plurality of individually selectable output legs;
load devices and switches coupled to the differential pair of transistors, wherein junctions between the differential pair of transistors and the load devices and switches form differential output nodes; and
shunt transistors to couple the output nodes to a common-mode reference node responsive to the control circuit.

11. The driver circuit of claim 10 wherein the control circuit is operable to provide a substantially PCI-Express compliant exit from an electrical idle state.

12. The driver circuit of claim 10 wherein the plurality of individually selectable output legs comprises two selectable output legs.

13. The driver circuit of claim 10 wherein the plurality of individually selectable output legs include transistors having sizes ratioed between the output legs.

14. An electronic system comprising:
an antenna;
a radio frequency circuit coupled to the antenna;
a controller coupled to the radio frequency circuit; and
a memory device coupled to the controller, the memory device including a differential pair of transistors, a tail current transistor coupled to provide a current to the differential pair of transistors, a bias circuit to bias the tail current transistor wherein the bias circuit includes a plurality of individually selectable output legs coupled in parallel, a control circuit responsive to a clock signal, the control circuit coupled to turn on the plurality of individually selectable output legs for at least one clock signal period and then turn off at least one of the plurality of individually selectable output legs, logic to allow the differential pair of transistors to be driven by a differential data signal to provide an output data signal, or to be driven by a control signal to turn off the differential pair of transistors, and a primer transistor coupled to provide a current path to the tail current transistor when the differential pair of transistors are turned off.

15. The electronic system of claim 14 further comprising a switching transistor coupled drain-to-source between a gate of the tail current transistor and a reference node, wherein the switching transistor is coupled to turn off the tail current transistor responsive to the control circuit.

16. The electronic system of claim 14 wherein the primer transistor is coupled to be responsive to the control circuit, and the primer transistor is turned on during the at least one clock signal period to provide a current path to the tail current transistor.

* * * * *